United States Patent
Loberg

(10) Patent No.: US 10,922,450 B2
(45) Date of Patent: Feb. 16, 2021

(54) ASSOCIATING COMPUTER-EXECUTABLE OBJECTS WITH TIMBER FRAMES WITHIN AN ARCHITECTURAL DESIGN ENVIRONMENT

(71) Applicant: DIRTT ENVIRONMENTAL SOLUTIONS INC., Salt Lake City, UT (US)

(72) Inventor: Barrie A. Loberg, Millarville (CA)

(73) Assignee: DIRTT ENVIRONMENTAL SOLUTIONS, LTD., Calgary (CA)

( * ) Notice: Subject to any disclaimer, the term of this patent is extended or adjusted under 35 U.S.C. 154(b) by 249 days.

(21) Appl. No.: 14/915,990

(22) PCT Filed: Jan. 13, 2015

(86) PCT No.: PCT/US2015/011105
§ 371 (c)(1),
(2) Date: Mar. 2, 2016

(87) PCT Pub. No.: WO2015/191112
PCT Pub. Date: Dec. 17, 2015

(65) Prior Publication Data
US 2017/0124224 A1 May 4, 2017

Related U.S. Application Data

(60) Provisional application No. 62/009,640, filed on Jun. 9, 2014.

(51) Int. Cl.
*G06F 30/13* (2020.01)
*E04C 3/30* (2006.01)

(52) U.S. Cl.
CPC .............. *G06F 30/13* (2020.01); *E04C 3/30* (2013.01)

(58) Field of Classification Search
CPC .. G06F 17/5004; G06F 2217/12; G06F 30/13; E04C 3/30
(Continued)

(56) References Cited

U.S. PATENT DOCUMENTS 3,972,163 A 8/1976 Coperthwaite
4,207,714 A 6/1980 Mehls
(Continued)

FOREIGN PATENT DOCUMENTS

CN 102902848 1/2013
EP 1066579 1/2002
(Continued)

OTHER PUBLICATIONS

ArcGIS, "Deleting duplicate features". ArcGIS 9.3 Webhelp Topic. Last modified Jul. 6, 2009 Release 9.3. pp. 1-2.*
(Continued)

*Primary Examiner* — Kamini S Shah
*Assistant Examiner* — John E Johansen
(74) *Attorney, Agent, or Firm* — Workman Nydegger

(57) ABSTRACT

A computer system can incorporate a timber framework within a variable spatial framework by receiving input to divide the variable spatial framework into one or more independent spaces within the variable spatial framework. Upon receiving input to divide the variable spatial framework, the system can create at least a first independent space and a second independent space based upon the received input. Creating the first independent space and the second independent space can also include associating with at least the first independent space a first independently executable software object. Additionally, the method can include automatically incorporating a digital representation of a first timber framework into the first independent space. The first (Continued)

independently executable software object can determine the characteristics of the first timber framework.

20 Claims, 10 Drawing Sheets

(58) Field of Classification Search
USPC .......................................................... 703/1
See application file for complete search history.

(56) References Cited

U.S. PATENT DOCUMENTS

| | | | |
|---|---|---|---|
| 4,705,401 A | | 11/1987 | Addleman |
| 4,964,060 A | * | 10/1990 | Hartsog ................ G06F 30/13 703/1 |
| 5,255,207 A | * | 10/1993 | Cornwell ........... G06Q 30/0283 703/1 |
| 5,625,827 A | | 4/1997 | Krause |
| 5,673,374 A | | 9/1997 | Sakaibara |
| 5,801,958 A | | 9/1998 | Dangelo |
| 5,866,419 A | | 2/1999 | Meder |
| 5,870,771 A | | 2/1999 | Oberg |
| 6,078,332 A | | 6/2000 | Ohazama |
| 6,097,394 A | | 8/2000 | Levoy |
| 6,268,863 B1 | | 7/2001 | Rioux |
| 6,292,810 B1 | | 9/2001 | Richards |
| 6,493,679 B1 | | 12/2002 | Rappaport |
| 6,580,426 B1 | | 6/2003 | Small |
| 6,629,065 B1 | | 9/2003 | Gadh |
| 6,900,841 B1 | | 5/2005 | Mihara |
| 6,971,063 B1 | | 11/2005 | Rappaport |
| 7,016,747 B1 | | 3/2006 | Ninomiya |
| 7,019,753 B2 | | 3/2006 | Rappaport |
| 7,062,454 B1 | | 6/2006 | Giannini |
| 7,085,697 B1 | | 8/2006 | Rappaport |
| 7,096,173 B1 | | 8/2006 | Rappaport |
| 7,099,803 B1 | | 8/2006 | Rappoport |
| 7,155,228 B2 | | 12/2006 | Rappaport |
| 7,171,208 B2 | | 1/2007 | Rappaport |
| 7,216,092 B1 | | 5/2007 | Weber |
| 7,243,054 B2 | | 7/2007 | Rappaport |
| 7,246,045 B1 | | 7/2007 | Rappaport |
| 7,277,830 B2 | | 10/2007 | Loberg |
| 7,292,908 B2 | * | 11/2007 | Borne ................ G06Q 10/06 700/182 |
| 7,299,168 B2 | | 11/2007 | Rappaport |
| 7,299,416 B2 | | 11/2007 | Jaeger |
| 7,623,137 B1 | | 11/2009 | Miller |
| 7,817,823 B1 | | 10/2010 | O'Donnell |
| 7,825,937 B1 | | 11/2010 | Sakhartchouck |
| 8,150,660 B2 | | 4/2012 | Reghetti |
| 8,255,338 B1 | | 8/2012 | Brittan |
| 8,271,336 B2 | | 9/2012 | Mikurak |
| 8,276,008 B2 | | 9/2012 | Ke |
| 8,276,088 B2 | | 9/2012 | Ke et al. |
| 8,285,707 B2 | | 10/2012 | Day |
| 8,290,849 B2 | | 10/2012 | Eisler |
| 8,301,527 B2 | | 10/2012 | Tarbox |
| 8,332,401 B2 | | 12/2012 | Hull |
| 8,332,827 B2 | | 12/2012 | Edde |
| 8,335,789 B2 | | 12/2012 | Hull |
| 8,386,918 B2 | | 2/2013 | Do |
| RE44,054 E | | 3/2013 | Kim |
| 8,402,473 B1 | | 3/2013 | Becker |
| 8,411,086 B2 | | 4/2013 | Rieffel |
| 8,423,391 B2 | | 4/2013 | Hessedenz |
| 8,510,382 B2 | | 4/2013 | Purdy |
| 8,442,850 B2 | | 5/2013 | Schorr |
| 8,521,737 B2 | | 8/2013 | Hart |
| 8,566,419 B2 | | 10/2013 | Purdy |
| 8,600,989 B2 | | 12/2013 | Hull |
| 8,626,877 B2 | | 1/2014 | Greene |
| 8,645,973 B2 | | 2/2014 | Bosworth |
| 8,650,179 B2 | | 2/2014 | Driesch |
| 8,773,433 B1 | | 7/2014 | Smyrl |

| | | | |
|---|---|---|---|
| 2001/0044707 A1 | | 11/2001 | Gavin et al. |
| 2003/0011596 A1 | | 1/2003 | Zhang |
| 2004/0027371 A1 | | 2/2004 | Jaeger |
| 2004/0075655 A1 | | 4/2004 | Dunnett |
| 2004/0100465 A1 | | 5/2004 | Stowe |
| 2004/0174358 A1 | | 9/2004 | Takagi |
| 2005/0044133 A1 | | 2/2005 | Hashimoto |
| 2005/0071135 A1 | | 3/2005 | VredenBurgh |
| 2005/0072059 A1 | | 4/2005 | Hodsdon |
| 2005/0104883 A1 | | 5/2005 | Snyder |
| 2006/0041842 A1 | | 2/2006 | Loberg |
| 2006/0274064 A1 | | 12/2006 | Dougherty |
| 2007/0098290 A1 | | 5/2007 | Barton |
| 2007/0109310 A1 | | 5/2007 | Xu |
| 2007/0171223 A1 | * | 7/2007 | McArdle ................ G06T 19/00 345/420 |
| 2007/0276791 A1 | | 11/2007 | Fejes |
| 2008/0249756 A1 | * | 10/2008 | Chaisuparasmikul ........................ G06F 17/5004 703/13 |
| 2009/0128558 A1 | | 5/2009 | Morello |
| 2009/0145075 A1 | | 6/2009 | Oakley |
| 2009/0187389 A1 | | 7/2009 | Dobbins |
| 2010/0018141 A1 | | 1/2010 | Kelly |
| 2010/0036520 A1 | | 2/2010 | Barbir |
| 2010/0121626 A1 | | 5/2010 | Montana et al. |
| 2010/0128038 A1 | | 5/2010 | Hoffman |
| 2010/0268513 A1 | | 10/2010 | Loberg |
| 2011/0054652 A1 | | 3/2011 | Heil |
| 2011/0191706 A1 | | 8/2011 | Loberg |
| 2011/0227922 A1 | | 9/2011 | Shim |
| 2011/0227924 A1 | | 9/2011 | Nakajima |
| 2011/0265405 A1 | | 11/2011 | Ksenych |
| 2012/0078583 A1 | * | 3/2012 | Kupferle ............. G06F 17/5004 703/1 |
| 2012/0288184 A1 | | 11/2012 | Zomet |
| 2014/0095122 A1 | * | 4/2014 | Appleman .............. G06F 30/13 703/1 |
| 2014/0176530 A1 | | 6/2014 | Pathre |
| 2015/0171515 A1 | | 6/2015 | Milroy |
| 2015/0324940 A1 | * | 11/2015 | Samson ................ G06Q 10/08 705/7.23 |
| 2015/0332496 A1 | | 11/2015 | Howell |
| 2015/0381265 A1 | | 12/2015 | Runyon et al. |
| 2016/0117419 A1 | | 4/2016 | Loberg |
| 2017/0077610 A1 | | 3/2017 | Bongard et al. |
| 2017/0124224 A1 | | 5/2017 | Loberg |

FOREIGN PATENT DOCUMENTS

| | | |
|---|---|---|
| EP | 1066579 B1 | 1/2002 |
| EP | 2207140 | 7/2010 |
| JP | 02-039377 A | 2/1990 |
| JP | 2000132706 | 5/2000 |
| JP | 2007264707 | 10/2007 |
| KR | 1020090126574 | 12/2009 |
| WO | 02059545 | 8/2002 |
| WO | 2005114495 | 12/2005 |
| WO | 2007138560 | 12/2007 |
| WO | 2009111885 | 9/2009 |
| WO | 2013040016 | 3/2013 |
| WO | 2012126010 | 9/2012 |
| WO | 2012162442 | 11/2012 |
| WO | 2012173741 | 12/2012 |
| WO | 2014191828 | 12/2014 |

OTHER PUBLICATIONS

Ravi Mamoorthi et al., "A First-Order Analysis of Lighting, Shading, and Shadows," ACM Transactions on Graphics, vol. 26, No. 1, Article 2, Jan. 31, 2007. See p. 2, 8, and 12-15.

ERCO, "ERCO Guide," http://www.erco.com/download/ data/30_media/_guide_pdf/ 120_en/_erco_guide_7_simulation.pdf, May 12, 2006. See p. 376, 389-388, 399, and 427.

Joseph Zupko et al., "System for Automated Interactive Lighting (SAIL)," In: Proceedings for the 4th International Conference on Foundations of Digital Games, 2009, pp. 223-230. See pp. 223-226.

(56) References Cited

OTHER PUBLICATIONS

Maxwell Render, "Maxwell Render 2.5 User Manual," http://www.architektur.uni-kl.de/digitalewrkzeuge/ss13/digitalewerkzeuge/maxwel-english.pdf, Dec. 31, 2010. See p. 22-25, 36-37, and 48-49.
Jeremy Birn, "Digital Lighting and Rendering," Pearson Education, 2nd ed., 2006, ISBN 0132798212. See p. 35-59.
Pierre-Felix Breton, "Autodesk Revit and 3ds Max Design for Lighting and Daylighting simulation," http://www.pfbreton.com/wordpress/wp-content/uploads/2012/05/L12L07%20Handout.pdf, May 7, 2012. See pp. 28, 51-52, and 87-103.
David Cohn, "Photorealistic Rendering Techniques in AutoCAD3D," Autodesk University 2009, http://www.dscohn.com/AU/handouts/AU214-2%20-%20Photorealistic%20Rendering%20Techniques%20in%20AutoCAD%203D.pdf, Dec. 31, 2009. See pp. 4-6.
International Search Report and Written Opinion for PCT/US2012/068805 dated Aug. 29, 2013.
International Search Report and Written Opinion for PCT/US2013/024009 dated Oct. 25, 2013.
International Search Report and Written Opinion for PCT/US2013/024063 dated Oct. 25, 2013.
International Search Report and written opinion for PCT/US2013/023198 dated Oct. 18, 2013.
CG Blog; "Photoshop tutorial and post-production glasses"; www.grafica3dblog.it/photoshop_tutorial_glass.htm; pp. 1-7.
International Search Report and Opinion, PCT/US2013/045047, dated Mar. 13, 2014.
International Search Report and Opinion, PCT/US2013/043735, dated Feb. 27, 2014.
International Search Report and Opinion, PCT/US2013/050764, dated Feb. 27, 2014.
Ram Schacked et al.: "Automatic Lighting Design Using a Perceptual Quality Metric"; 2001; Eurographic 2011 vol. 20 (2001); p. 1-12
Non-Final Office action for U.S. Appl. No. 14/113,260 dated Sep. 14, 2015.
Non-Final Office action for U.S. Appl. No. 14/348,879 dated Sep. 22, 2015.
Non-Final Office Action for U.S. Appl. No. 14/110,910 dated Sep. 14, 2015.
Final Office Action for U.S. Appl. No. 14/110,910 dated Feb. 2, 2016.
Final Office Action for U.S. Appl. No. 14/348,879 dated Feb. 22, 2016.
Notice of Allowance for U.S. Appl. No. 14/113,260 dated Mar. 23, 2016.
International Search Report and Opinion, PCT/US2015/011105, dated May 5, 2015.
BeLight, Live Interior 3D Pro User's Manual, 2010.
Whitted, an Improved Illumination Model for Shaded Display, Jun. 1980, Communications of the ACM, vol. 23 No. 6.
"Chuang, Efficient Image-Based Methods for Rendering Soft Shadows, 2006, URL:http://www.csie.ntu.edu.tw/~cyy/curses/rendering/06fall/lectures/handouts/lec15_sshadow1 .pdf".
"Wiki, List of color spaces and their uses, 2012, URL:https://en.wikipedia.org/w/index.php?title=List_of_color_spaces_and_their_uses&oldid=507999322".
Wynn, Cube Maps, 2001, URL: https://developer.nvidia.com/sites/default/files/akamai/gamedev/docs/CubeMaps.pdf.
Drettakis, Interactive Update of Global Illumination Using a Line-Space Hierarchy, ACM SIGGRAPH 97.
Cruless, Ray Tracing URL: http://courses.cs.washington.edu/courses/cse557/09au/lectures/ray-tracing.pdf, Washington University, CSE 557 Falll 2009. pp. 1-40.
Non-Final Office Action in U.S. Appl. No. 14/110,910 dated Aug. 12, 2016.
John Chapman: "john-chapman.net—Deferred Rendering, Transparency & Alpha Blending ", Aug. 1, 2011 (Aug. 1, 2011), pp. 1-7, XP0552959287, Retrieved from the Internet: URL:http://www.john-chapman.net/content.php?id=13 [retrieved on Aug. 17, 2016].
Anonymous: OpenGL FAQ / 15 Transparency, Translucency, and Using Blending. Dec. 30, 1999 (Dec. 30, 1999), XP055273530, Retrieved from the Internet: URL: http://www.opengl.org/archives/resources/faq/technical/transparency.htm [retrieved on May 19, 2016].
Supplementary European Search Report for application No. EP13/873,685 dated Sep. 7, 2016.
Lau et al., "Converting 3D Furniture Models to Fabricate Parts and Connectors", ACM Transactions on Graphics Jul. 2011.
Non-Final Office Action in U.S. Appl. No. 14/115,299 dated Jan. 3, 2017.
International Search Report PCT/IB2014/001055, dated Mar. 24, 2014.
Supplementary European Search Report for application No. EP13873507 dated Jun. 15, 2017.
Gene S. Miller et al: "Illumination and Reflection Maps: Simulated Objects in Simulated and Real Environments", Course Notes for Advanced Computer Graphics Animation, SIGGRAPH 1984, Jul. 23, 1984 (Jul. 23, 1984), pp. 1-7, XP055372329, Retrieved from the Internet: URL:http://www.pauldebevec.com/ReflectionMapping/IlluMAP84.html [retrieved on May 12, 2017] sections 3-8.
Wolfgang Heidrich et al: "Realistic, hardware-accelerated shading and lighting", Computer Graphics Proceedings. SIGGRAPH 99; [Computer Graphics Proceedings. SIGGRAPH], ACM ?—New York, NY, USA 1515 Broadway, 17th Floor New York, NW 10036 USA, Jul. 1999 (Jul. 1999), pp. 171-178, XP058128790, DOI: 10.1145/311535.311554 ISBN: 978-0-201-48560-8 Sections 3 and 4.
"Autodesk Revit architecture for AutoCAD Users", White Paper, Autodesk, Inc., 2011.
Non-Final Office Action in U.S. Appl. No. 14/115,299 dated Jul. 28, 2017.
Non-Final Office action for U.S. Appl. No. 14/117,844 dated Sep. 8, 2017.
Singapore Search Report and Written Opinion for application No. 11201608357X dated Oct. 2, 2017.
Non-Final Office Action for U.S. Appl. No. 14/891,007 dated Jan. 26, 2018.
Non-Final Office Action for U.S. Appl. No. 14/117,844 dated Sep. 29, 2016.
European Search Report for application No. EP 13/872,502 dated Aug. 17, 2016.
Michael Kass: "Interactive Depth of Field Using Simulated Diffusion on a GPU", 2006, pp. 1-8, XP002760859, Retrieved from the Internet: URL: http://graphics.pixar.com/library/DepthOfField/paper.pdf [retrieved on Aug. 17, 2016].
Shaan Hurley: "Learn to Walk and Fly in AutoCAD", Jan. 23, 2009 (Jan. 23, 2000), pp. 1-7, XP002760860, Retrieved from the Internet: URL: http://autodesk.blogs.com/between_the_lines/2009/01/learn-to-walk-and-fly-in-autocad.html [retrieved on Aug. 17, 2016].
Jean-Eudes Marvie et al: "The FL-system: a functional L-system for procedural geometric modeling", The Visual Computer; International Journal of Computer Graphics, Springer, Berlin, DE, vol. 21, No. 5, Jun. 1, 2005 (Jun. 1, 2005), pp. 329-339, XP019339112, ISSN:1432-8726, DOI: 10.1007/S00371-005-0289-Z.
Supplementary European Search Report for application No. EP13885841 dated Sep. 30, 2016.
Notice of Allowance in U.S. Appl. No. 14/110,910 dated Dec. 13, 2016.
Supplementary Search Report for application No. EP13885779 dated Dec. 16, 2016.
"Lau, M. ei al., Converting 3D furniture models to fabricatable parts andconnectors. ACM Transactions on Graphics (TOG)—Proceedings of ACMSIGGRAPH2011, Jul. 31, 2011, vol. 30, No. 4, pp. 1-8".
Search Report and Written Opinion for application No. 11201605983T dated May 13, 2018.
Xu, W. et al., Joint-aware manipulation of deformable models. ACM Transactions on Graphics, Aug. 7, 2009, vol. 28, No. 3, pp. 1-9.
Search Report and Written Opinion for application No. 11201605818V dated Apr. 21, 2018.
Supplementary European Search Report for application No. PCT/US2015011105 dated Apr. 4, 2018.

(56) References Cited

OTHER PUBLICATIONS

"Revit Architecture 2011 User's Guide. Apr. 30, 2010, http://images.autodesk.com/adsk/files/revit_architecture_2011_user_guide_en_pdf.": pp. 9-14.
Chen et. al., "Shell texture functions", Proceedings of ACM SIGGRAPH 2004, the 31st International Conference on Computer Graphics and Interactive Techniques, Papers, pp. 343-353, Aug. 8-12, 2004 (Aug. 8, 2001), also published in ACM Transactions on Graphic (TOG) Journal, vol. 23 Issue 3, Aug. 2004 (Aug. 1, 2004), pp. 343-353, Aug. 2005 (Aug. 1, 2005) [retrieved on Aug. 21, 2018 (Aug. 21, 2018) from: https://dl.acm.org/citation.cfm?id=1015726].
Office Action for European Application No. 15794044.6 dated, Apr. 8, 2020.
Mathias Nousch et al: "CAD on the World Wide Web,"
Proceedings / VRML 99, Fourth Symposium on the Virtual Reality Modeling Language, Paderborn, Germany, Feb. 23-26, 1999, ACM, New York, NY, USA, Feb. 23, 1999 (Feb. 23, 1999), pp. 113-119, XP058236211 DOI: 10.1145/299246.299283 ISBN: 978-1-58113-079-9.
Notice of Eligibilty for Grant for Chinese Application No. 11201606050X dated, Jan. 21, 2020.
European Intention for Grant for Application No. 13873685 dated, Feb. 11. 2020.
CG BLOG; "Photoshop tutorial and Post-producted glasses"; captured Jan. 6, 2011; www.grafica3dblog.it/photoshop_tutorial_glass.htm; pp. 1-7.
Chuang, Efficient Image-Based Methods for Rendering Soft Shadows, 2006, URL: http://www.csie.ntu.edu.tw/~cyy/courses/rendering/06fall/lectures/handouts/lec15_sshadow1.pdf.
Hara, Light Source Position and Reflectance Estimation from a Single View without the Distant Illumination Assumption, 2005, IEEE Transactions on Pattern Analysis and Machine Intelligence, vol. 27, No. 4.
International Search Report and Written Opinion for application No. 11201606050X dated Dec. 10, 2018.
Non-Final Office Action in U.S. Appl. No, 14/115,299 dated Dec. 30, 2016.
Nousch Met Al: "CAD on the World Wide Web: virtual assembly of furniture with Beaver", Proceedings/VRML 99, Fourth Symposium on the Virtual Reality Modeling Language, Paperborn Germany, Feb. 23-26, 1999, ACM New York, NY, USA, Feb. 23, 1999 (Feb. 23, 1999), pp. 113-119, XP002172203, DOI: 10.1145/299246.299283 ISBN: 978-1-58113-079-9.
Office Action received for Canadian Application No. 2883079, dated Apr. 22, 2020, 3 pages.
Office Action received for European Patent Application No. 13885779.2, dated Jun. 18, 2020, 15 pages.
Office Action received for European Patent Application No. 14804947.1, dated Jun. 18, 2020, 8 pages.
Pov-Wiki, Light Source-Spotlights, 2012, URL: http://wiki.povray.Org/content/Reference:Light_Source#Spotlights.
Ram Shacked et al.; "Automatic Lighting Design Using a Perceptual Quality Metric"; 2001; Eurographics 2011 vol. 20 (2001); pp. 1-12.
Supplementary European Search Report for application No. EP131873,685 dated Aug. 19, 2016.
Supplementary European Search Report for application No. PCT/US2013043735 dated Sep. 30, 2016. Feb. 27, 2014.
Office Action received for SG Application No. 11201605818V, dated Aug. 24, 2020, 4 pages.

\* cited by examiner

ASSOCIATING COMPUTER-EXECUTABLE OBJECTS WITH TIMBER FRAMES WITHIN AN ARCHITECTURAL DESIGN ENVIRONMENT

CROSS-REFERENCE TO RELATED APPLICATIONS

The present invention is a 35 U.S.C. § 371 U.S. National Stage of PCT Application No. PCT/US15/11105, filed on Jan. 13, 2015, which claims the benefit of priority to U.S. Provisional Application No. 62/009,640, filed Jun. 9, 2014. The entire content of each of the aforementioned patent applications is incorporated herein by reference.

BACKGROUND OF THE INVENTION

The Field of the Invention

The present invention relates generally to computer-aided design or drafting software.

Background and Relevant Technology

As computerized systems have increased in popularity, so have the range of applications that incorporate computational technology. Computational technology now extends across a broad range of applications, including a wide range of productivity and entertainment software. Indeed, computational technology and related software can now be found in a wide range of generic applications that are suited for many environments, as well as fairly industry-specific software.

One such industry that has employed specific types of software and other computational technology increasingly over the past few years is that related to building and/or architectural design. In particular, architects and interior designers ("or designers") use a wide range of computer-aided design (CAD) software or building information (BIM) software for designing the aesthetic as well as functional aspects of a given residential or commercial space. For example, a designer might use a CAD or BIM program to design a building or part of a building, and then utilize drawings or other information from that program to order or manufacture building components.

The design and build of buildings or other architectural elements such as mezzanines can be an expensive and time consuming process, and conventional automation of such designs is minimal. For example, conventional systems may require a building to be meticulously designed within a CAD or BIM program. Further, prior to designing the building or architectural element within the CAD or BIM program, conventional systems may require that the specifications of the end product be exactly known ahead of time. As such a designer may need to know the exact dimensions of the objects being designed, along with all of the building features such as wall type and thickness, building materials, door placement, etc. Conventional downstream manufacturing processes are then typically performed through manual interpretation of drawings and manual input into manufacturing systems.

In at least some conventional systems, a designer or manufacturer may incur great expense if any design changes are made after the initial CAD model is created. If, for example, a designer discovers that an initial measurement was incorrect, the designer may need to adjust or even recreate the entire design manually, taking into account the correct measurement. In addition, large cost can be incurred by simply switching from one provider to another. For example, different construction methods may use different joints, different hardware, different materials, materials of different dimensions, etc. As mentioned above, even slight changes such as these may require significant reworking of the CAD design.

Accordingly, there are a number of problems in the art that can be addressed.

BRIEF SUMMARY OF THE INVENTION

Implementations of the present invention overcome one or more problems in the art with systems, methods, and computer program products for automatically incorporating a timber framework into an architectural design. For example, in at least one implementation of the present invention, as a designer designs and manipulates an architectural design, an independently executable software object can provide corresponding characteristics that are automatically incorporated into a timber framework within the architectural design. Similarly, in at least one implementation, the software can leverage multiple independently executable software objects that are associated with the architectural design to automatically configure a timber framework to incorporate architectural component specific features. One will appreciate that this can provide a number of advantages to designers incorporating a timber framework within a design.

For example, a method in accordance with at least one implementation for creating a timber framework within a variable spatial framework can include receiving a variable spatial framework for use in designing and manufacturing an architectural component. The variable spatial framework may digitally define the architectural component. The method can further include receiving input to divide the variable spatial framework into one or more independent spaces within the variable spatial framework. Upon receiving input to divide the variable spatial framework, the system can create at least a first independent space and a second independent space based upon the received input. Creating the first independent space and the second independent space can also include associating with at least the first independent space a first independently executable software object. Additionally, the method can include automatically incorporating a digital representation of a first timber framework into the first independent space. The first independently executable software object can determine the characteristics of the first timber framework.

In an additional or alternative implementation, a method can include receiving a variable spatial framework for use in designing and manufacturing an architectural component. The variable spatial framework can digitally define the architectural component. In addition, the method can include receiving input to divide the variable spatial framework into one or more independent spaces within the variable spatial framework. Upon receiving input to divide the variable spatial framework, the system can then perform a step of creating at least a first independent space and a second independent space based upon the received input. Creating the first independent space and the second independent space can include associating with the first independent space a first independently executable software object and associating with the second independent space a second independently executable software object. Additionally, the method can include automatically incorporating a digital representation of a first timber framework into the first independent space. In this case, both the first independently executable software object and the second independently executable software object can at least partly determine the structure and characteristics of the timber framework.

These and other objects and features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof, which are illustrated in the appended drawings. It should be noted that the figures are not drawn to scale, and that elements of similar structure or function are generally represented by like reference numerals for illustrative purposes throughout the figures. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
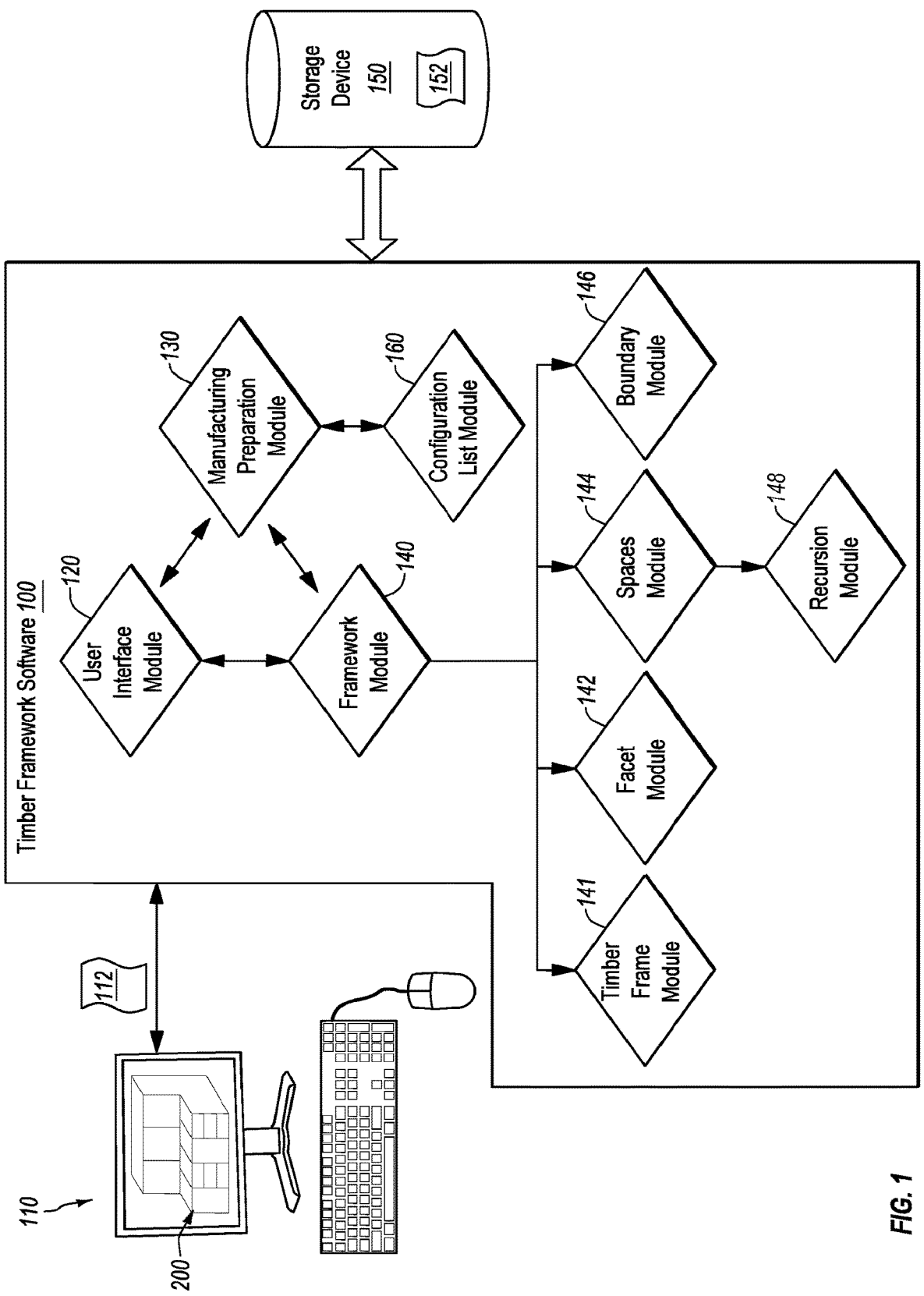
FIG. 1 is a schematic illustration of a system for designing and manufacturing an architectural element in accordance with an implementation of the present invention.

Implementations of the present invention extend to systems, methods, and computer program products for automatically incorporating a timber framework into an architectural design. For example, in at least one implementation of the present invention, as a designer designs and manipulates an architectural design, an independently executable software object can provide corresponding characteristics that are automatically incorporated into a timber framework within the architectural design. Similarly, in at least one implementation, the software can leverage multiple independently executable software objects that are associated with the architectural design to automatically configure a timber framework to incorporate architectural component specific features. One will appreciate that this can provide a number of advantages to designers incorporating a timber framework within a design.

For example, in at least one implementation of the present invention, a designer can use an object oriented timber frame program to create a spatial framework representative of an architectural component, for example, a timber frame mezzanine. As the user is creating the framework of the mezzanine, the timber frame program can automatically create the timber framework that will make up the architectural component, such as by analyzing the user's input. In particular, in at least one implementation, one or more spaces within the spatial framework can be associated with independently executable software objects. The software objects can automatically determine the characteristics of the timber framework that will allow for structural stability and provide for the features that the user specified when creating the architectural component.

Additionally, in at least one implementation of the present invention, a designer can create an architectural structure that comprises multiple rooms and/or levels. In particular, various spaces within the architectural structure can be associated with independently executable software objects. The software objects can be mutually aware of each other, and can track the required features and interactions of each respective space. As such, in at least one implementation, the independently executable software objects can automatically adjust based upon input received from a designer.

Additionally, in at least one implementation, one or more modules in the timber frame program can identify and track space by assigning an independently executable software object to the space. Using an independently executable software object, the space can have independent functions and variables associated with it. As needed, these functions and variables can automatically adjust the space, and in turn the timber framework that defines and partially encloses the space in response to manufacturing specifications and manufacturer specific components.

Additionally, in at least one implementation, one or more components or modules in the system can automatically incorporate specific features and specifications from a third party manufacturer. In many cases, for example, different manufacturers may use different hardware, different types of joints, and various other different manufacturing elements that each may require unique adjustments to the timber framework. For example, when manufacturing a house, a first facility may use walls of a specific thickness, while a second facility may use walls of a different thickness. In at least one implementation, the architectural design can automatically adjust the timber framework to incorporate either size of wall. One will appreciate that the ability to automatically incorporate third party features into an architectural design after the design is substantially complete can provide significant benefits.

Implementations of the present invention can also allow a user to create a timber framework for an architectural element without knowing many of the end features that will be incorporated into the architectural element.

For example, in at least one implementation, a user can create a timber framework for an entire building without knowing the material that will be used, the dimensions of the resulting building, the specific internal walls, and many other similar details. Once the timber framework is completed, a specific manufacturing facility can enter in the details of its materials, components, configurations, and the actual specifications and/or dimensions of the end product, and the timber framework can automatically adjust to conform to the entered information.

Turning now to the Figures, FIG. 1 depicts an architectural schematic diagram of a computer system for designing and manufacturing an architectural element. In particular, FIG. 1 shows that an exemplary computer terminal 110 can be in communication with a timber frame software application 100. The timber frame software application 100 can be executed from the computer terminal 110, from a server (not shown) that the computer terminal 110 is accessing, or by using some other known method of execution. One will appreciate that the computer terminal 110 can comprise any computerized device that enables execution of computerized instructions, including any desktop, laptop, or mobile computing device.

FIG. 1 further shows that the timber frame software application 100 can comprise a plurality of modules 120, 130, 140, 141, 142, 144, 146, 148, 160 that are adapted to aid in designing a file for timber. For example, FIG. 1 depicts an implementation in which the timber frame software application 100 comprises a user interface module 120, a manufacturing preparation module 130, a framework module 140, a timber framework module 141, a facet module 142, a spaces module 144, a boundary module 146, a recursion module 148, a configuration list module 160, and a storage device 150. One will understand, however, that separating modules into discrete units is at least somewhat arbitrary and that modules can be combined, associated, or separated in ways other than shown in FIG. 1 and still accomplish the purposes of this invention. Accordingly, the particular modules 120, 130, 140, 141, 142, 144, 146, 148, 160 of FIG. 1 are only shown for illustrative and exemplary purposes of at least one implementation.

In addition, FIG. 1 shows that the user interface module 120 can communicate with the computer terminal 110 through a series of data packets 112. For example, the user interface module 120 can display images and graphical controls to a user through a computer monitor and can receive input from a user through a keyboard and/or mouse. As a user creates and/or manipulates a particular framework of an architectural element, the user interface module 120 can communicate to—and receive instructions from—the framework module 140. FIG. 1 further shows that the framework module 140 can, in turn, communicate with the timber framework module 141, the facet module 142, the spaces module 144, the boundary module 146, the recursion module 148, and the configuration list module 160.

Ultimately, either user interface module 120 or framework module 140 can communicate with manufacturing preparation module 130 to create a file that is prepared for use in a manufacturing facility. Additionally, FIG. 1 shows that the various modules 141-148 can communicate with a storage device 150. The storage device 150 can contain, among other things, templates for a variety of different designs, completed designs that can be used on a standalone basis, or designs that can be incorporated into other designs. Additionally, the storage device 150 can also contain tool lists and/or manufacturing information specific to particular manufacturing facilities, and/or to particular design features.

One will appreciate in view of the specification and claims herein that the user interface module 120 provides to the user an option to create and make design changes to a framework 200. In at least one implementation for example, upon receiving a request for some modification, the user interface module 120 can communicate the request to the framework module 140. For example, a user may desire to design a mezzanine for production at a timber frame manufacturing facility. Accordingly, a user may enter instructions into the computer terminal 110 to design and create the mezzanine. The user interface module 120 can, in turn, communicate those instructions to the framework module 140.

Upon receiving the instructions, the framework module 140 can then communicate with the appropriate module to execute the request. For example, if the user desires to split the upper surface of the mezzanine into two portions, the framework module 140 communicates with the facet module 142, which can modify and track surfaces within the framework 200. In contrast, and as will be understood more fully herein, if the user desires to split a space into two spaces, the framework module 140 can alternatively use the spaces module 144, which can modify and track spaces within the framework 200. In either case, the framework module 140 can also communicate with the timber framework module 141, which can automatically configure a timber framework that conforms to the user's input.

For instance, the spaces module 144 can allow the user to split the framework 200 in half and create one half of the mezzanine that might be an open space plan with no walls between the timbers, and another half that is closed in with walls between the timbers. Additionally, a user may use the spaces module 144 to split the framework 200 into any number of other divisions, for example thirds. Of course, one will appreciate that the divisions do not need to be proportional, or equal. For instance, the spaces module 144 can allow a user to move the single split mentioned above such that the open space will only take up one-third of the framework, while the walled space takes up the remaining two-thirds. Based upon the user's input, the timber framework module 141 can create the appropriate timber framework for a mezzanine with the appropriate number of columns and walls.

In at least one implementation, the facet module 142 can perform similar functions on surfaces within the framework 200. For example, the facet module 142 can be used to create a split in the front plane of the mezzanine to create large double doors for that space. Similar to the spaces module 144, the facet module 142 can also be used to create split surfaces of different sizes. The timber framework module 141 can then incorporate an appropriate timber framework into the design to allow for a room, or other facet created feature.

In addition, the framework module 140 can use the boundary module 146 to automatically check joints within the framework 200 (FIGS. 2A-2B) to determine if any "anomalies" exist. For example, if a user specifies that a particular joint should be a miter joint, the boundary module 146 can analyze all of the joints within the mezzanine to determine whether the remaining boundaries properly form around the entire mezzanine. If the boundary module 146 detects any anomalies, (e.g., improperly overlapped joints, or other inappropriate positioning), the boundary module 146 can automatically resolve them and create proper joints throughout the mezzanine.

Once the user has finished designing the architectural element (in this case a mezzanine), the manufacturing preparation module 130 can receive manufacturing facility specific details from the configuration list module 160, and can receive specifications relating to the final details of the architectural element. For example, a particular manufacturing facility may use a dovetail joint to assemble the timber frame components. Additionally, the facility may use a particular type of wood that comprises a specific thickness. Upon receiving this information from the configuration list module 160, the manufacturing preparation module 130 can communicate instructions to the appropriate modules 141, 142, 144, 146 to automatically adjust the framework. For example, upon receiving instructions from the manufacturing preparation module 130, the timber framework module 141 can automatically adjust the timber framework of the mezzanine to create a design that incorporates the dovetail joint, wood type and wood thickness, and that can be manufactured at the facility. In contrast, in at least one implementation, the manufacturing preparation module 130 may not make any changes to the actual framework 200, but instead the manufacturing preparation module 130 may make the necessary changes to the actual manufacturing code (e.g., CNC code).

In at least one implementation, the manufacturing preparation module 130 can also automatically prepare the same framework 200 to be manufactured in any number of different facilities, even though each facility may have specific manufacturing requirements. Specifically, once a particular framework 200 has been designed, the framework 200 can be used at a number of different manufacturing facilities as long as the configuration list module 160 has access to a configuration list 152 that is associated with the specific facility. The configuration list 152 can be stored in the storage device 150, accessed through a network connection, or otherwise made available to the software 100.

Figure 2A:
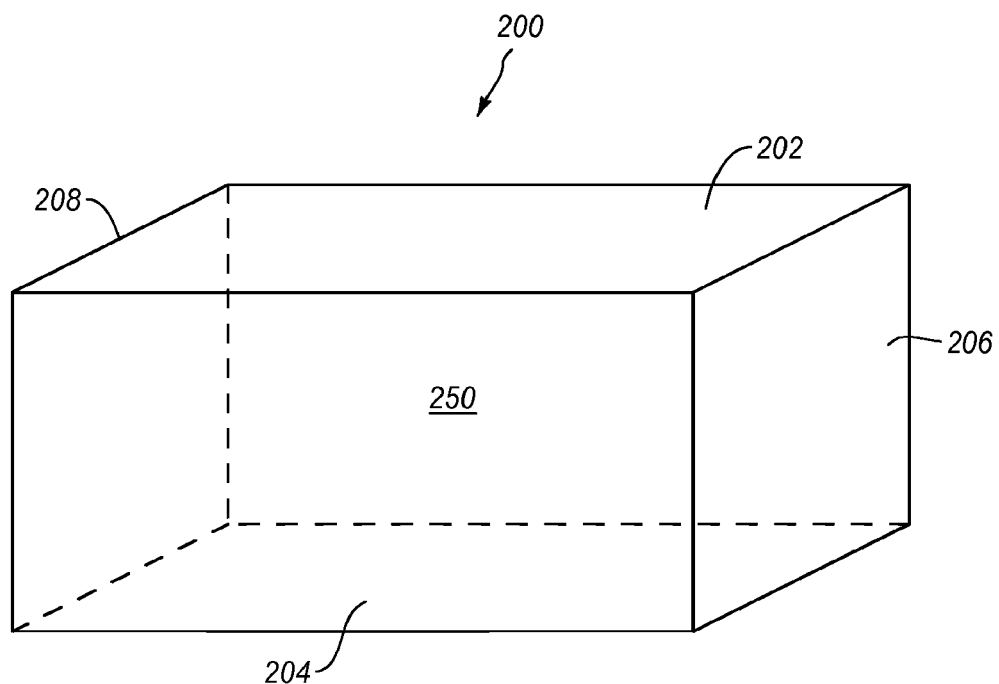
FIG. 2A illustrates a spatial framework created in accordance with the inventive system illustrated in FIG. 1

FIGS. 2A-2D depict various implementations of a spatial framework 200. As shown in FIG. 2A, the spatial framework 200 can initially comprise a simple cube. In at least one implementation, the timber frame software 100 can provide a plurality of different, simply shaped frameworks 200 that can be used as starting points for designing different architectural elements. In general, the spatial framework 200 can be a computer model of an architectural element that captures the design intent of a user.

In particular, the spatial framework 200 can capture data relating to the outline of an architectural element and the position of components in the element with respect to each other. To accomplish this, the spatial framework 200 can comprise a space 250 that is associated with an independently executable software object. The independently executable software object can assist in tracking and managing the various components of the designed architectural element. In at least one implementation, the space 250 and independently executable software object are both managed by the spaces module 144.

By way of explanation, an independently executable software object comprises a set of computer-executable instructions used in object-oriented program code, and which relate to a particular physical component or feature. In addition, software objects can be interrelated via parent/child dependency relationships where changes in a parent object flow through to a child object and vice versa. For example, a software object created for a mezzanine may have several child objects for each column.

In other cases, the software objects can be related to other software objects that represent physically proximate components (e.g., a wall object that is positioned next to the timber object). For example the above-mentioned mezzanine software object and column software objects can independently execute in a correlated fashion to ensure each corresponding physical component (i.e., the mezzanine top floor surface, or the column) is positioned appropriately, or otherwise colored and designed consistent with the user's specifications. For example, a column software object can identify that its location next to a wall renders a physical column unnecessary, and accordingly can automatically incorporate a bracket to attach directly to the wall in place of a physical column.

FIG. 2A also depicts that the framework 200 can comprise "facets" 202, 204, 206 and boundaries 208. By way of explanation, "facets" 202, 204, 206 represent surfaces within the framework. Facets 202, 204, 206, however, may not always correlate to surfaces within the finished architectural element. For example, facets 202, 204, 206 may only be quasi-two-dimensional because they can comprise a specified thickness. In some cases, a user can set the thickness of a particular facet to be zero. As a result the facet can still be a part of the framework 200 but it will not be a part of the finished architectural element. "Boundaries," on the other hand, represent lines where facets meet. In at least one implementation, a specific boundary's location can be defined with respect to the other boundaries that the specific boundary intersects.

Figure 2B:
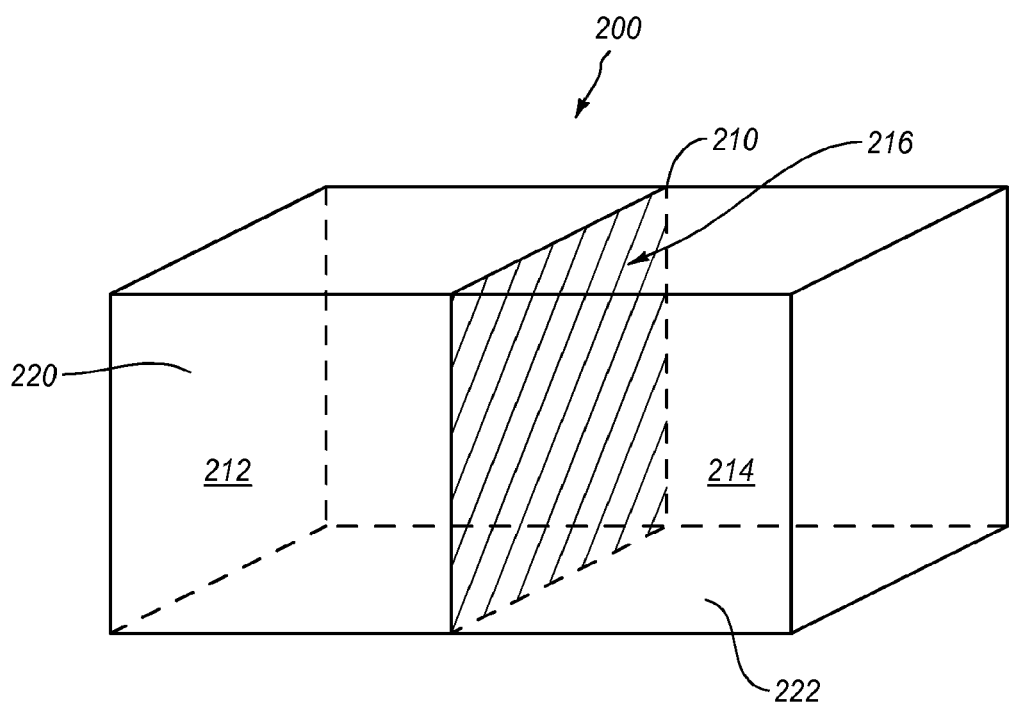
FIG. 2B illustrates the spatial framework of FIG. 2A, after a designer has inserted a cube splitter in accordance with an implementation of the present invention.

FIG. 2B depicts an implementation of a framework 200 that has been bisected by a "cube splitter" 210. As depicted, the cube splitter 210 splits or divides space 250 in half, creating two new spaces 212 and 214. In at least one implementation, the creation of two new spaces 212, 214 also results in the creation of two new independently executable software objects (not shown), which are associated with each space 212, 214. In at least one implementation, a user can specify what particular architectural components that executable software objects are intended to represent (e.g., timber column or beam, wall, door, window). It should be understood that while cubes and squares are used to illustrate embodiments of the present invention within this application, in at least one implementation, many different shapes and configurations of a framework 200 can be used.

In at least one implementation, the newly created independently executable software objects associated with spaces 212 and 214 may each inherit the parameters and characteristics of the independently executable software object that was originally associated with space 250. Due to this inheritance, if space 250 originally comprises a building with multiple floors, after the split, spaces 212 and 214 can each comprise separate, independently executable software objects that correspondingly comprise apartments that mirror the floor divisions of space 250. In at least one implementation, the independently executable software object that was originally associated with space 250 continues to exist and, in part, functions to manage the two new independently executable software objects that are now associated with the new spaces 212, 214.

The cube splitter 210 can also create a new facet 216 within the framework 200 and a plurality of new facets (for example 220, 222) on each external surface of the framework 200. As mentioned above, the new facets 216, 220, 222 can each comprise a unique thickness, such that the facets 216, 220, 222 comprise physical surfaces within the architectural element. Similarly, or alternatively, the facets 216, 220, 222 can comprise thicknesses of zero, resulting in the facets 216, 220, 222 only being represented within the framework 200 but not within the finished architectural element.

Figure 2C:
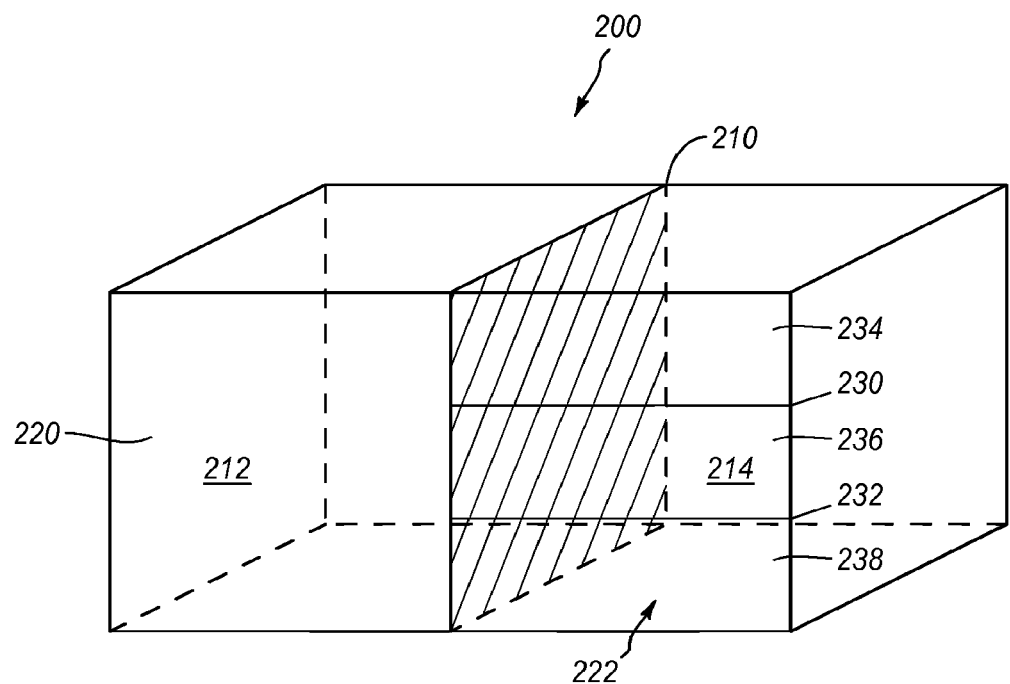
FIG. 2C depicts the spatial framework of FIG. 2B upon implementation of one or more facet splitters in accordance with an implementation of the present invention.

FIG. 2C depicts the framework 200 of FIG. 2B, albeit comprising two facet splitters 230, 232. As depicted, the facet splitters 230, 232 can split facet 222 (created from splitting facet 204) into three new facets 234, 236, 238. In at least one implementation, a facet splitter 230, 232 is configured to split only facets, such as facets 220, 222, 234, 236, 238. This is as opposed to a cube splitter 210, which can be configured in at least one implementation to split an entire space 250 (i.e., into spaces 212, 214, FIGS. 2B-2C). In addition, in at least one implementation, the new facets 234, 236, 238 remain associated with space 214, and thus can be associated with the independently executable software object that is associated with space 214. In an alternative embodiment, each facet 234, 236, 238 can be associated with its own independently executable software object.

Figure 2D:
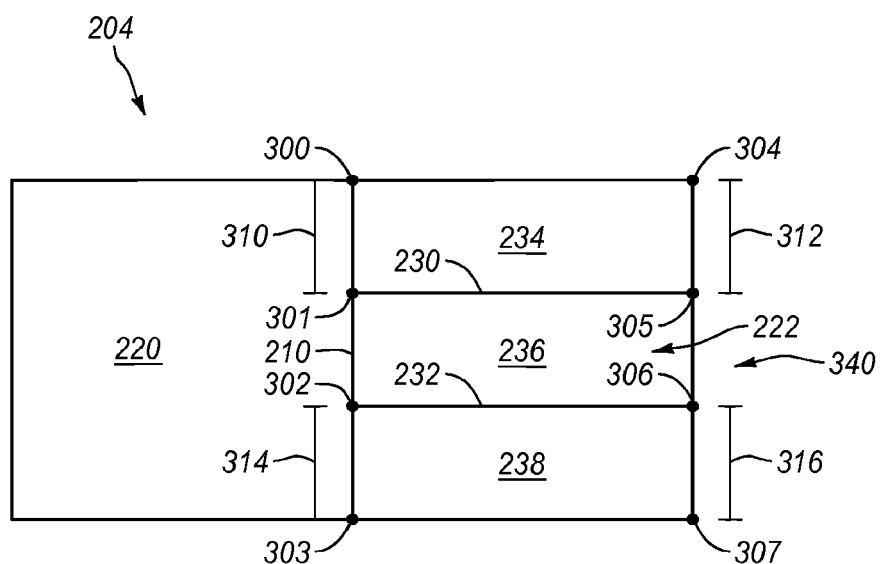
FIG. 2D depicts a planar view of a spatial framework created in accordance with an implementation of the present invention.

FIG. 2D depicts a quasi-two-dimensional view of front face 204 of the framework 200 from FIG. 2C, after various space and facet splitting. As mentioned previously, the view is quasi-two-dimensional because each facet can in fact comprise a thickness, when so set by the user. Accordingly, FIG. 2D shows facet 220, which was formed by the placement of cube splitter 210, and facets 234, 236, and 238, which were formed by the placement of facet splitters 230 and 232. Additionally, FIG. 2D depicts the end point 300, 301, 302, 303, 304, 305, 306, 307, 320, 322 of each boundary within the front face of the framework. In at least one implementation, a user can interact with the framework 200 through either a three-dimensional view (e.g., FIGS. 2A-2C) or through a quasi-two-dimensional view (e.g., FIG. 2D). In either view, the location and behavior of the facets can be managed by the facet module 142.

In at least one implementation, the location and positioning of the cube splitters 210 and facet splitters 230, 236, 238 within the framework can be tracked with respect to the end points 300, 301, 302, 303, 304, 305, 306, 307, 320, 322 of each respective facet splitter 230, 236, 238 or cube splitter 210, and in particular, where those end points intersect other boundaries. In at least one implementation, the location of the end point intersections can be tracked as a finite distance or as a proportion of the total length of the respective boundary.

For example, FIG. 2D shows that facet splitter 230 comprises end points 301 and 305. In at least one implementation, the location of facet splitter 230 can be designated as end point 301 being located distance 310 from the top of cube splitter 210, and end point 305 being located distance 312 from the top of side boundary 340. Similarly, the location of facet splitter 232 can be designated as end point 302 being positioned ⅓ up the length of cube splitter 210, and similarly, end point 306 being located ⅓ up the length of side boundary 340.

One will understand that using a finite length or a proportional length can impact the future manufacture of the architectural element. For example, if a user resizes an item in framework 200 by expanding the framework in all directions, then facet splitter 230 can still be located distance 310 and distance 312 from the top of cube splitter 210, and from the side boundary 340 respectively. Facet splitter 232, on the other hand, can change in absolute position such that each end point 302, 306 is ⅓ up the length of their respective boundaries 210, 340 (e.g., between points 300/303 and/or 304/307), without regard to the actual length of boundaries 210 and 340.

In at least one implementation, the framework 200 can be shrunk so much that absolute distance 310 and distance 312 exceed ⅔ of the total length of boundaries 210 and 340 respectively. One will understand that this can cause facet splitter 230 to overlap facet splitter 232. In this situation, the framework module 140 can automatically determine that either facet splitter 232 or facet splitter 230 should automatically be removed leaving only a single facet splitter 230 or 232, but not both. For example, in at least one implementation, a user can set an option to automatically give fixed lengths 310, 312 priority over proportional lengths 303, 316, or to automatically give proportional lengths 303, 316 priority over fixed lengths 310, 312.

Additionally, a user may be able to set an option that gives priority to the first facet splitter 230, 232, or to cube splitter 210 created over subsequent facet splitters 230, 232, or to cube splitter 210. In contrast, a user may be able to set an option that gives priority to the last facet splitter 230, 232, or to cube splitter 210 created over previous facet splitters 230, 232, or to cube splitter 210. Further, in at least one implementation, a user can specifically designate that a particular facet splitter 230, 232, or cube splitter 210, should be given priority over other facet splitters 230, 232, and/or cube splitters 210.

Allowing a user to determine whether a facet splitter or cube splitter should be located on a proportional distance basis, or on an absolute distance basis, can provide the user with significant control over how an architectural element can be resized and manipulated. Additionally, allowing a user to determine the priority that particular cube splitters and/or facet splitters can be given when the splitters conflict with each other allows a user to have control over the final configuration of an architectural element that has been resized. One will understand that in at least one implementation, the location of facets 220, 234, 236, 238 can impact the timber framework of a particular architectural component. As such, using the above-described methods, a user can exercise significant control over the proportion and layout of an architectural component, and the timber framework module 141 can automatically incorporate a timber framework into the architectural piece in accordance with the user's specifications.

Figure 3A:
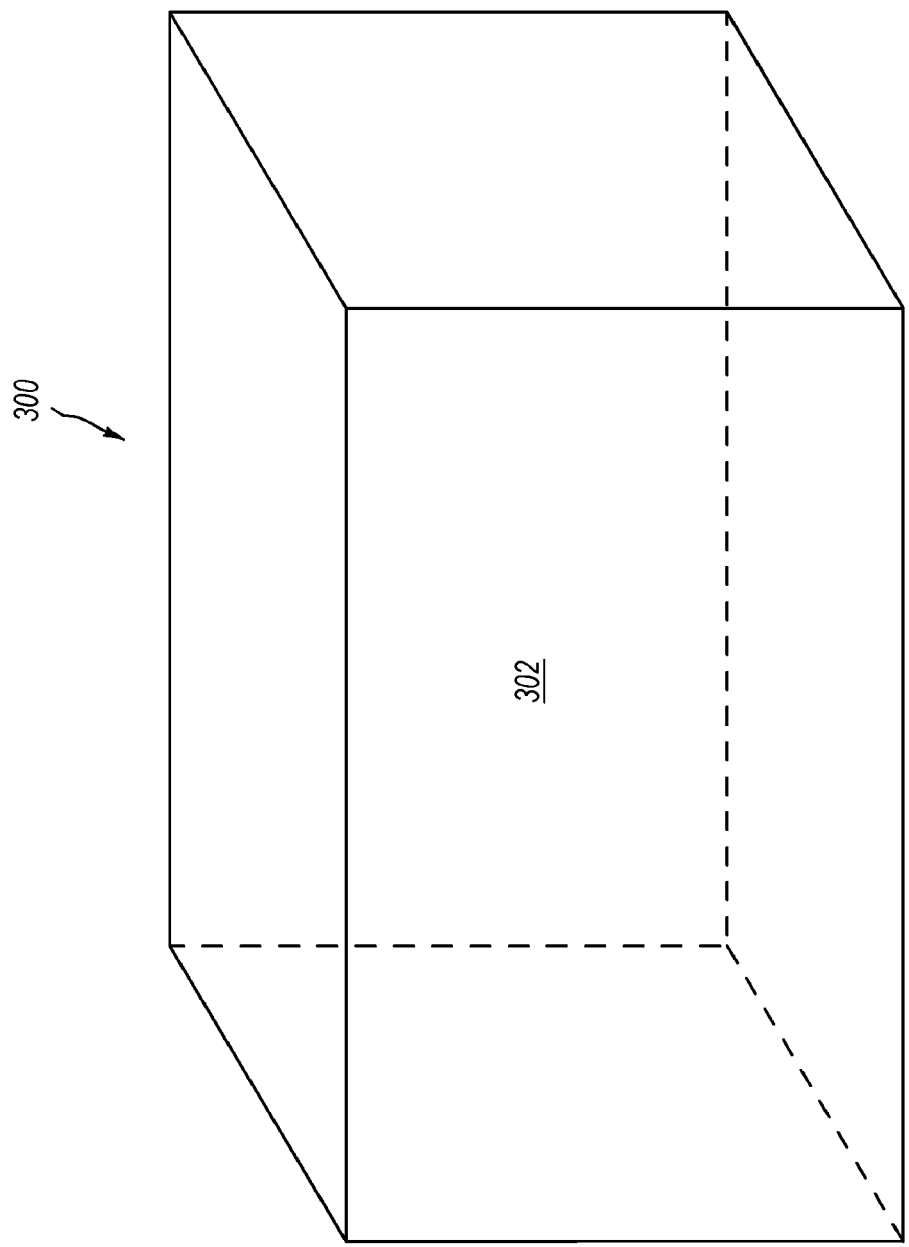
FIG. 3A illustrates another spatial framework in accordance with the inventive system illustrated in FIG. 1.

FIGS. 3A-3E depict various implementations of a timber framework incorporated into the variable spatial frameworks similar to those described in FIGS. 2A-2D. In particular, FIG. 3A depicts a spatial framework 300 that comprises a rectangular cube. In at least one implementation, an independently executable software object that is associated with space 302 determines the timber framework's characteristics and form. One will understand that there are a variety of different shapes and configurations that the spatial framework 300 can take—other than rectangular—and still conform to the timber frame software 100 within this disclosure. In at least one implementation, the independently executable software object automatically determines the particular configuration of a timber framework based upon input received from a user. For example, a user may indicate that a particular spatial framework is being used to design a mezzanine. Accordingly, the independently executable software object can configure the timber framework in a way that is most conducive for a mezzanine.

Figure 3B:
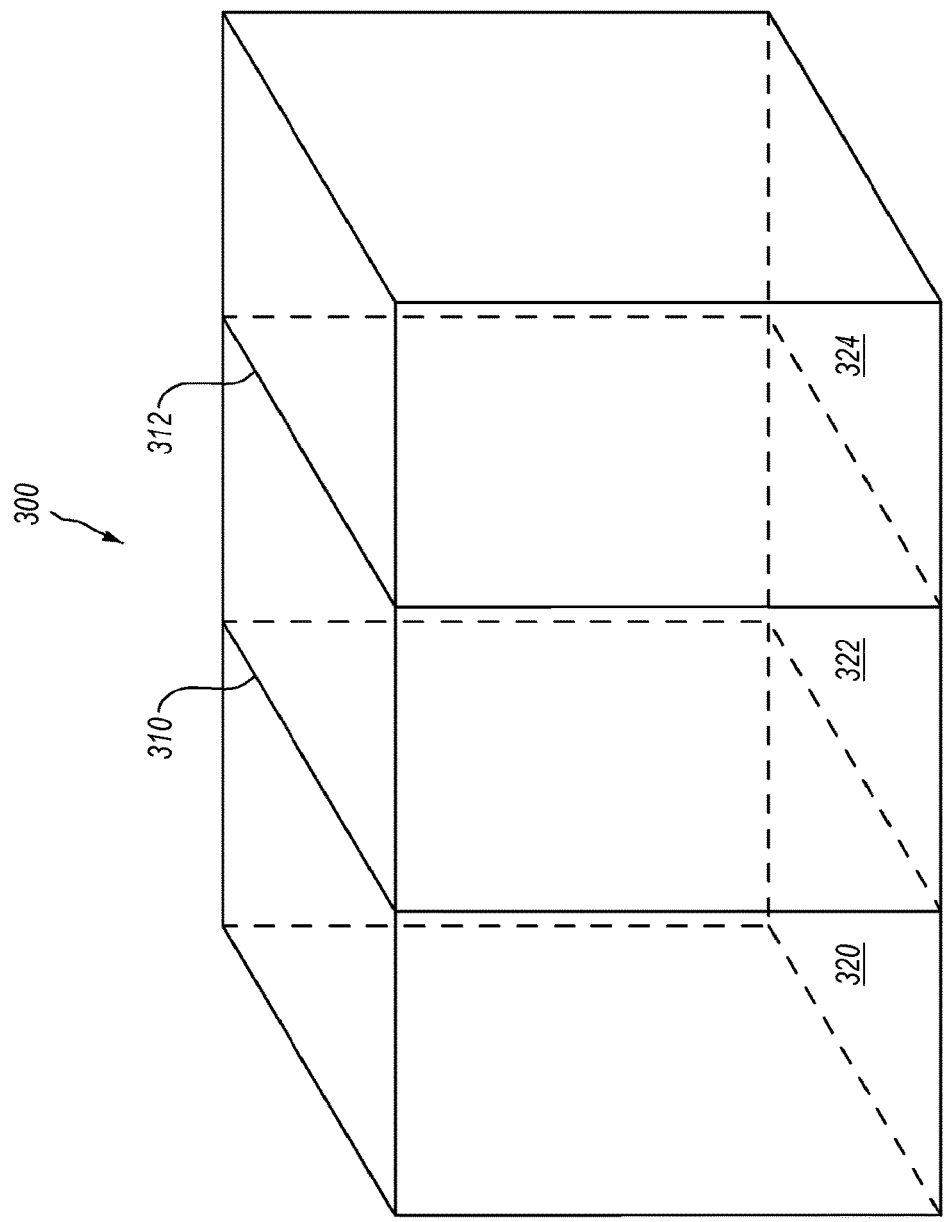
FIG. 3B illustrates the spatial framework of FIG. 3A, after a designer has inserted two cube splitters in accordance with an implementation of the present invention.

For example, FIG. 3B depicts an implementation of the variable spatial framework 300 from FIG. 3A that has been intersect by a first cube splitter 310 and a second cube splitter 312. After the cube splitters 310, 312 are inserted the spaces module 144 can create three new spaces 320, 322, 324 in the place of the original space 302. Additionally, the spaces module can also create three new independently executable software objects (not shown) that are associated with each space 320, 322, 324 respectively. In at least one implementation, the spatial framework 300 can be associated with a scale, such that a designer is able to create spaces of certain dimensions. For example, the spatial framework may comprise a height that is associated with a desired mezzanine height and a length that is similarly associated with a desired mezzanine length.

Figure 3C:
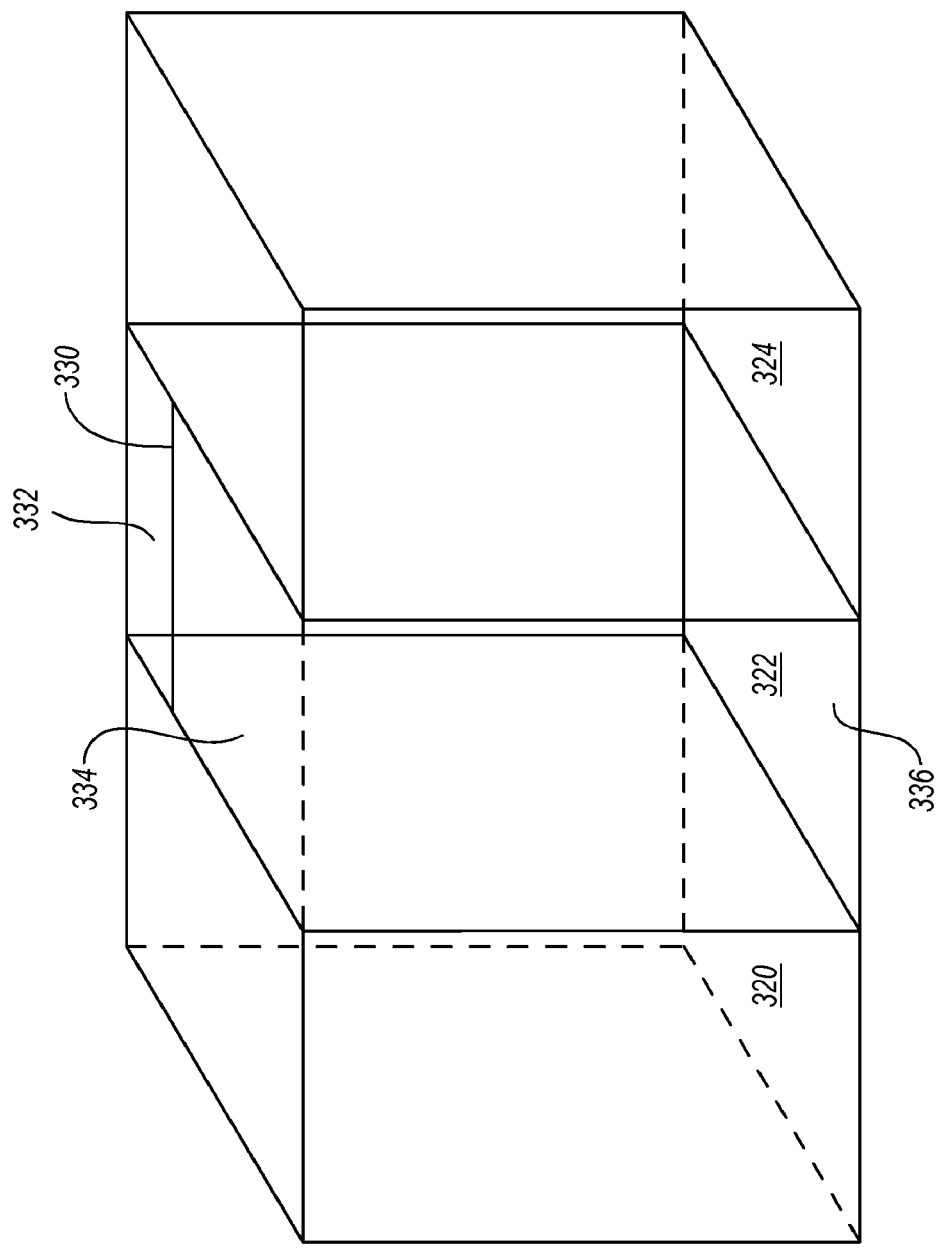
FIG. 3C depicts the spatial framework of FIG. 3B upon implementation of a facet splitters in accordance with an implementation of the present invention.

Returning to the figures, FIG. 3C depicts an implementation of the variable spatial framework of FIG. 3B wherein a surface (i.e., a facet) has been bisected by a facet splitter 330. In contrast to the cube splitters 310, 312 that were depicted in FIG. 3B, the facet splitter 330 does not completely bisect space 322. Instead, the facet splitter 330 bisects the upper surface of space 322 and creates two facets 332, 334.

After creating the two facets 332, 334, a designer can designate that each of the facets comprise unique attributes. For example, the designer can designate that facet 332 comprise a solid surface of a particular dimension and material such as a constructed wall. The designer can also designate that facet 334 comprise a width zero, which de facto designates facet 334 as open space. Additionally, in creating this exemplary mezzanine the designer can designate that facet 336 comprise a width of zero, and thus in effect remove facet 336 from the final product.

Figure 3D:
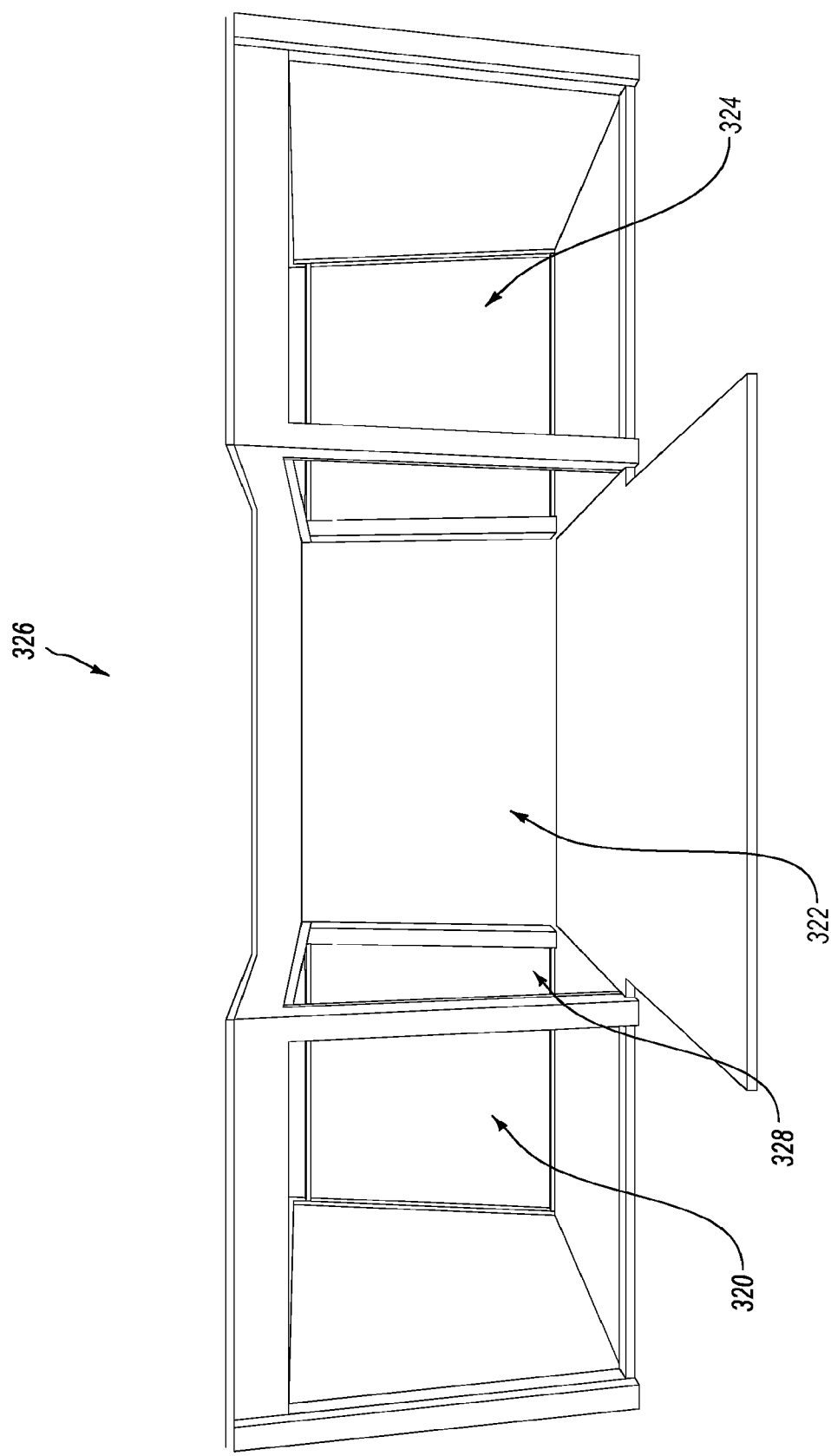
FIG. 3D depicts an implementation of a timber framework incorporated into the spatial framework of FIG. 3C.

In FIG. 3D, the timber framework module 141 has applied a timber framework 326 to the spatial framework 300 of FIG. 3C. In at least one implementation of the timber frame software 100, the user interface module 120 can display a digital rendering of the timber framework 326 to a designer. Additionally, a designer may be able to view a timber framework 326 at different points during the design of a spatial framework 300. For example, a designer may wish to view the timber framework 326 throughout the entire design process.

Each space 320, 322, 324 of FIG. 3C now comprises a room or area within FIG. 3D. Additionally, each space is still associated with an independently executable software object. In at least one implementation, when creating the timber framework 326, the timber framework module 141 relies upon the independently executable software objects to determine the characteristics and parameters for the timber framework 326. For example, the independently executable software objects may comprise information relating to the type of framework (e.g., type of wood, dimensions of wood, placement of wood) that should be used. Additionally, the independently executable software objects may also be mutually configurable. For example, if a designer designates the independently executable software object associated with space 320 as comprising a pine attribute, one or more of the independently executable software objects can communicate the attribute to each other, such that the entire mezzanine structure is pine. Similarly, in at least one implementation, if a designer adjusts an attribute within space 322, the independently executable software objects can automatically make adjustments to ensure that the mezzanine is structurally sound. In at least one implementation, the independently executable software object can make these various changes by passing data among themselves and by performing various calculations.

Accordingly, once a timber framework 326 has been created, or during the design of a timber framework 326, a user can provide material constraints or specifications to the independently executable software objects, that cause the timber framework 326 to automatically adjust to conform to the new constraints. In at least one implementation, the independently executable software objects also allow a spatial framework 300 to be dynamically adjustable without requiring significant redesign work. For example, in at least one implementation, the dimensions of the mezzanine can be expanded or shrunk, and the independently executable software objects can automatically make the necessary changes to the timber framework 326.

Figure 3E:
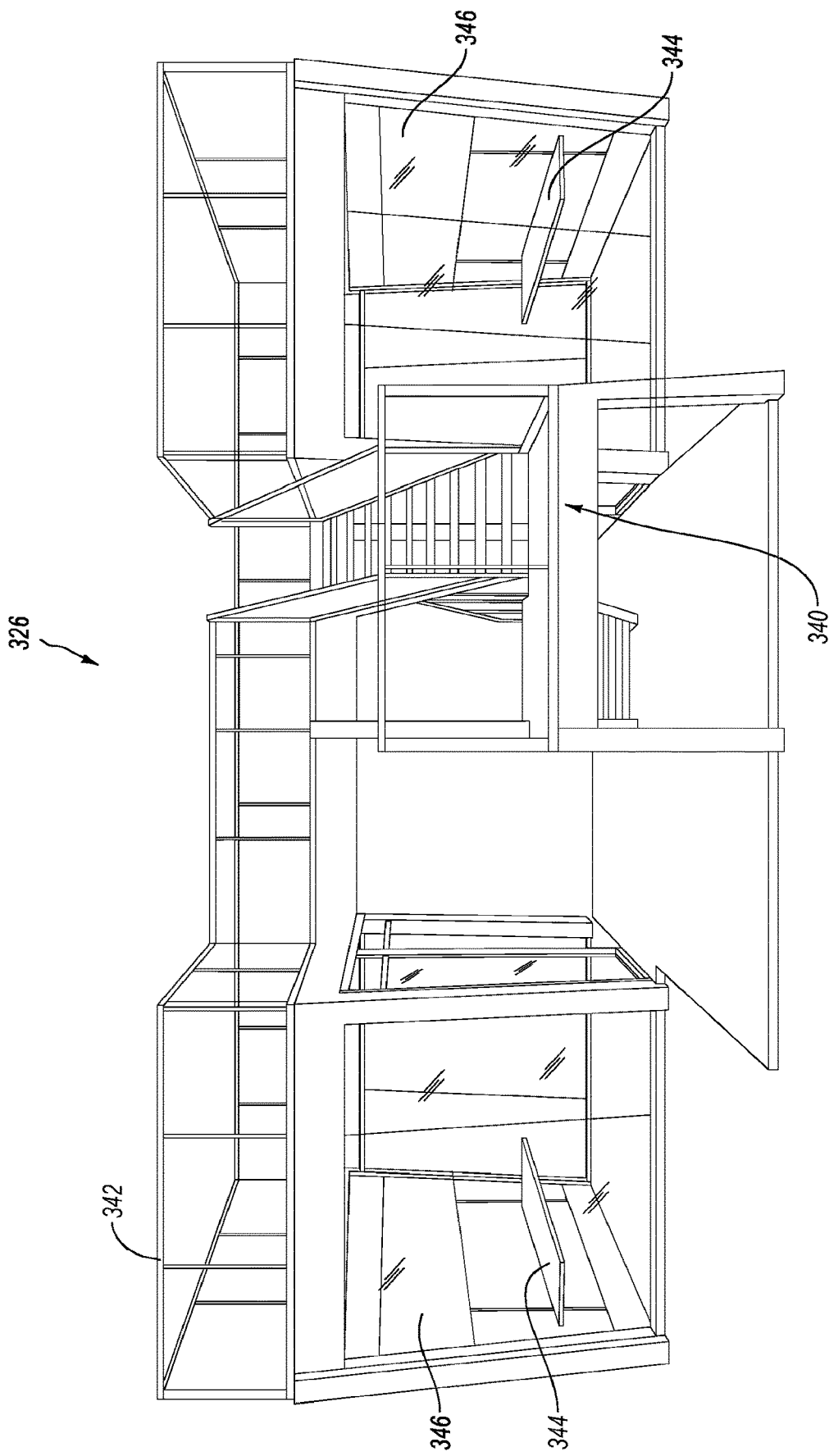
FIG. 3E depicts an implementation of a timber framework incorporated of FIG. 3C with additional features incorporated.

FIG. 3E depicts the mezzanine of FIG. 3C with additional features and adornments. For example, each of the rooms comprises one or more walls 346 and one or more wall attachments 344. In at least one implementation, the configuration of the walls is determined, at least in part, by the independently executable software object. For example, the independently executable software object can comprise directions that specific walls should be of a glass material, while other walls should comprise wood.

Additionally, in at least one implementation, the independently executable software objects can also allow for major features, such as stairs 340, to be added to a timber framework 326. For example, the independently executable software objects may coordinate the proper placement, structure, and design of a set of stairs 340. In at least one implementation, a designer can pick a particular location and configuration of a set of stairs 340 and the independently executable software object can make the necessary additional configurations for the stairs to match the mezzanine and to be safe.

In at least one implementation, a designer can designate that the mezzanine comprises an upper floor. The independently executable software objects can make the necessary adjustments to the timber framework 326 to ensure that the upper floor is structurally sound. Additionally, in at least one implementation, one or more of the independently executable software objects can configure a railing 342 that is positioned around the top of the mezzanine. For example, an independently executable software object can adjust an attached railing 342 so that the railing matches the style of the space 320, 322, 324 with which the independently executable software object is associated.

Additionally, in at least one implementation, the timber framework software 100 can automatically incorporate a variety of third party features into a timber framework. For example, various different railings 342 can be automatically incorporated into the timber framework. In at least one implementation, one or more independently executable software objects can automatically adjust and manipulate the timber framework to allow for the addition of a particular railing.

In at least one implementation, each independently executable software object is primarily responsible for the configuration of a timber framework 326 that at least partially encloses the independently executable software object's respective space. For example, the timber framework 326 depicted into FIG. 3E comprises three spaces 320, 322, 324. The independently executable software object that is associated with space 320 may be primarily responsible for the configuration of the timber framework that at least partially surrounds space 320. Similarly, the independently executable software objects associated with space 322, 324 may be primarily responsible for the configuration of the timber frameworks that at least partially surround the respective spaces 322, 324.

In at least one implementation, independently executable software objects that are associated with adjacent spaces can create cooperative features. For example, FIG. 3D depicts adjacent spaces 320 and 322, which share a common wall

328. In at least one implementation, the independently executable software objects that are associated with spaces 320 and 322 can cooperatively define the structure and attributes of the shared wall 328. For example, in FIG. 3D the independently executable software objects created two pillars that both support the mezzanine upper floor and divides the two spaces 320, 322.

In addition to creating cooperative features, independently executable software objects can also communicate structural information to various other independently executable software object dispersed throughout a timber framework 326. For example, in at least one implementation the spaces 320, 322, 324 can communicate and adjust to ensure the structural stability of the entire mezzanine structure, including the upper floor.

Accordingly, FIGS. 1-3E and the corresponding text illustrate or otherwise describe one or more components, modules, and/or mechanisms for automatically incorporating timber framework into a variable spatial framework. One will appreciate that implementations of the present invention can also be described in terms of methods comprising one or more acts for accomplishing a particular result. For example, FIGS. 4 and 5 and the corresponding text illustrate or otherwise describe a sequence of acts in a method for automatically incorporating timber framework within an architectural design. The acts of FIGS. 4 and 5 are described below with reference to the components and modules illustrated in FIGS. 1-3E.

Figure 4:
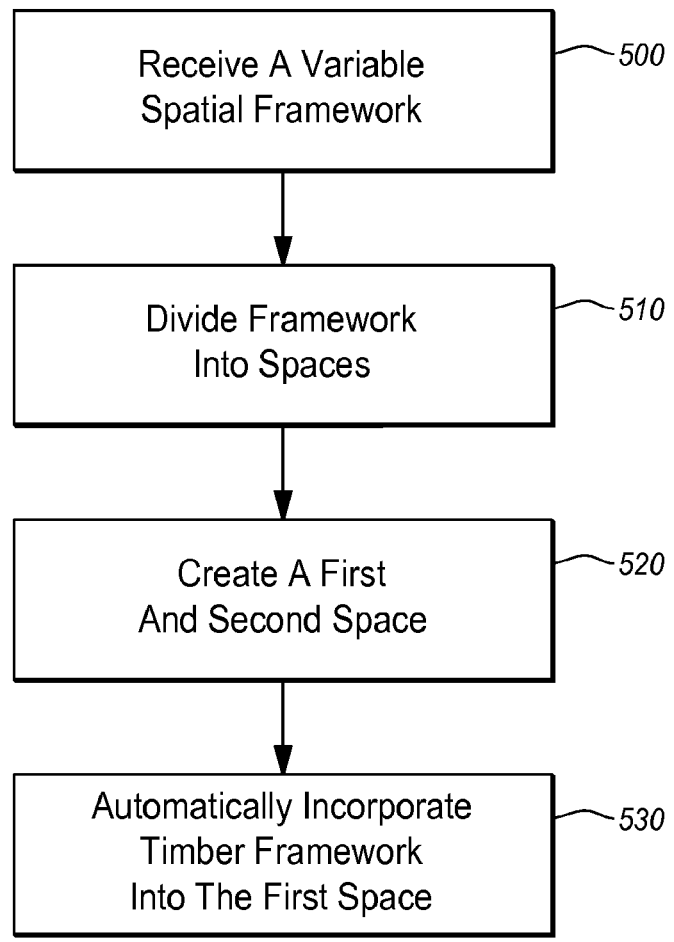
FIG. 4 depicts a flowchart of a sequence of acts in a method for incorporating a timber framework into an architectural design in accordance with at least one implementation of the present invention.
Figure 5:
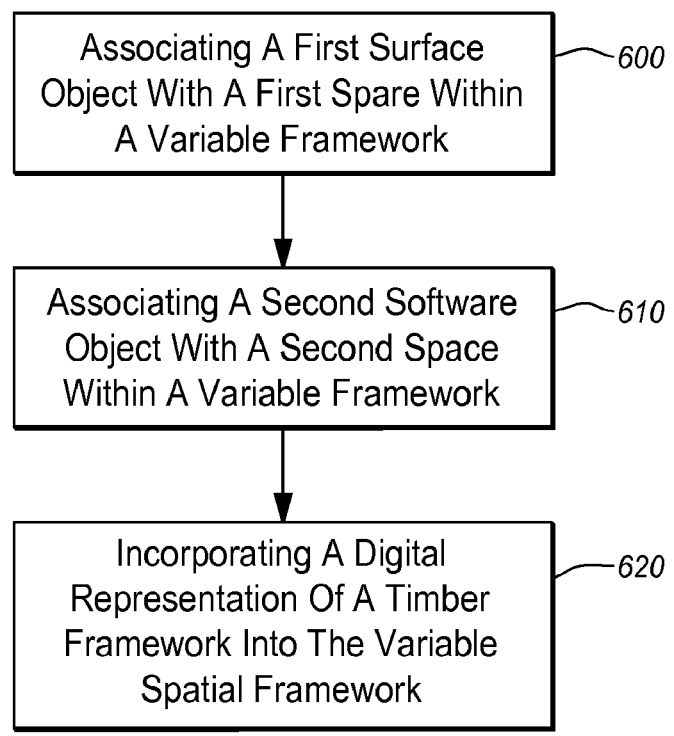
FIG. 5 depicts a flowchart of an additional or alternative method for incorporating a timber framework into an architectural design in accordance with at least one implementation of the present invention.

For example, FIG. 4 illustrates that a method for automatically incorporating a timber framework within architectural design can comprise an act 500 of receiving a variable spatial framework. Act 500 includes receiving a variable spatial framework for use in designing and manufacturing an architectural component, wherein the variable spatial framework digitally defines the architectural component. For example, in FIG. 2C and the accompanying description, the timber frame software 100 receives a variable spatial framework that may be the initial design of a furniture piece, a room, a house, a mezzanine, or some other similar architectural structure or component.

FIG. 4 also shows that the method can comprise an act 510 of dividing the variable spatial framework into spaces. Act 510 includes receiving input to divide the variable spatial framework into one or more independent spaces within the variable spatial framework. For example, FIG. 2B depicts a variable spatial framework that has been divided with a cube splitter 210. After the variable spatial framework is divided, two spaces 212, 214 are disposed within the variable spatial framework.

Additionally, FIG. 4 also shows that the method can comprise an act 520 of creating a first and second space. Act 520 includes creating at least a first independent space and a second independent space based upon the received input, wherein creating the first independent space and the second independent space includes associating with at least the first independent space a first independently executable software object.

For example, FIG. 2B depicts a variable spatial framework that has been divided into two spaces 212, 214 with a cube splitter 210. After the two spaces are created, as described above, an independently executable software object can be associated with at least the first space.

Further, FIG. 4 shows that the method can comprise an act 530 of automatically incorporating a timber framework into the first space. Act 530 can include automatically incorporating a digital representation of a first timber framework into the first independent space, wherein the characteristics of the first timber framework are determined by the first independently executable software object. For example, in FIG. 3D and the accompanying description describe a timber framework 326 is automatically incorporated into the spatial framework of FIG. 3C. As is further described above, an independently executable software object that is associated with the space 320, at least in part, determines characteristics relating to the timber framework that at least partially encloses the space 320. For example, the independently executable software object can determine, among other things, the type of wood framework, the type and location of fasteners, the thickness of specifications of the wood framework, and the general structure of the wood framework.

In addition to the foregoing, FIG. 5 illustrates that an additional or alternative method of automatically incorporating a timber framework within an architectural design can comprise an act 600 of associating a first software object with a first space within a variable framework. Act 600 includes associating a first independently executable software object with a first independent space within a variable spatial framework. For example, FIG. 2B depicts a variable spatial framework that has been divided into two spaces 212, 214 with a cube splitter 210. After the two spaces are created, as described above, an independently executable software object can be associated with at least the first space.

FIG. 5 also shows that the method can comprise an act 610 of associating a second software object with a second space within a variable framework. Act 610 includes associating a second independently executable software object with a second independent space within the variable spatial framework. In at least one implementation, the first independent space and the second independent space are adjacent to each other within the variable spatial framework. For example, FIGS. 2B-2C depicts a variable spatial framework that has been divided with a cube splitter 210. In addition, FIGS. 2B-2C show that after the variable spatial framework is divided, two spaces 212, 214 are disposed within the variable spatial framework. Additionally, it is described within the accompanying description that an independently executable software object can be associated with each space 212, 214.

Further, FIG. 5 also shows that the system can comprise an act 620 of incorporating a digital representation of a timber framework into the variable spatial framework. Act 620 includes automatically incorporating a digital representation of a timber framework into the variable spatial framework. In at least one implementation, the structure and characteristics of the timber framework are determined by at least both the first independently executable software object and the second independently executable software object. For example, FIG. 3D and the accompanying description describe a timber framework 326 is automatically incorporated into the spatial framework of FIG. 3C. As is further described above, an independently executable software object that is associated with the space 320, at least in part, determines characteristics relating to the timber framework that at least partially encloses the space 320. For example, the independently executable software object can determine, among other things, the type of wood framework, the type and location of fasteners, the thickness of specifications of the wood framework, and the general structure of the wood framework.

Accordingly, FIGS. 1-5 and the corresponding text illustrate or otherwise describe a number of components, schematics, and mechanisms for automatically incorporating a timber framework within an architectural design. One will appreciate that these components and modules in accordance with implementations of the invention can allow a designer to develop an architectural element, such as a desk, an entire kitchen, a house, a mezzanine, or any timber frame architectural structure without knowing the specific timber framework that will ultimately be created. For example, a user can design a kitchen, including cabinets, drawers, counter tops, sink locations, etc., without knowing the location or structure of the underlying timber framework. Similarly, a user can design a mezzanine without knowing the final dimensions of the mezzanine, material of construction, wall and door placement, and other similar attributes.

Embodiments of the present invention may comprise or utilize a special-purpose or general-purpose computer system that includes computer hardware, such as, for example, one or more processors and system memory, as discussed in greater detail below. Embodiments within the scope of the present invention also include physical and other computer-readable media for carrying or storing computer-executable instructions and/or data structures. Such computer-readable media can be any available media that can be accessed by a general-purpose or special-purpose computer system. Computer-readable media that store computer-executable instructions and/or data structures are computer storage media. Computer-readable media that carry computer-executable instructions and/or data structures are transmission media. Thus, by way of example, and not limitation, embodiments of the invention can comprise at least two distinctly different kinds of computer-readable media: computer storage media and transmission media.

Computer storage media are physical storage media that store computer-executable instructions and/or data structures. Physical storage media include computer hardware, such as RAM, ROM, EEPROM, solid state drives ("SSDs"), flash memory, phase-change memory ("PCM"), optical disk storage, magnetic disk storage or other magnetic storage devices, or any other hardware storage device(s) which can be used to store program code in the form of computer-executable instructions or data structures, which can be accessed and executed by a general-purpose or special-purpose computer system to implement the disclosed functionality of the invention.

Transmission media can include a network and/or data links which can be used to carry program code in the form of computer-executable instructions or data structures, and which can be accessed by a general-purpose or special-purpose computer system. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer system, the computer system may view the connection as transmission media. Combinations of the above should also be included within the scope of computer-readable media.

Further, upon reaching various computer system components, program code in the form of computer-executable instructions or data structures can be transferred automatically from transmission media to computer storage media (or vice versa). For example, computer-executable instructions or data structures received over a network or data link can be buffered in RAM within a network interface module (e.g., a "NIC"), and then eventually transferred to computer system RAM and/or to less volatile computer storage media at a computer system. Thus, it should be understood that computer storage media can be included in computer system components that also (or even primarily) utilize transmission media.

Computer-executable instructions comprise, for example, instructions and data which, when executed at one or more processors, cause a general-purpose computer system, special-purpose computer system, or special-purpose processing device to perform a certain function or group of functions. Computer-executable instructions may be, for example, binaries, intermediate format instructions such as assembly language, or even source code.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like. The invention may also be practiced in distributed system environments where local and remote computer systems, which are linked (either by hardwired data links, wireless data links, or by a combination of hardwired and wireless data links) through a network, both perform tasks. As such, in a distributed system environment, a computer system may include a plurality of constituent computer systems. In a distributed system environment, program modules may be located in both local and remote memory storage devices.

Those skilled in the art will also appreciate that the invention may be practiced in a cloud computing environment. Cloud computing environments may be distributed, although this is not required. When distributed, cloud computing environments may be distributed internationally within an organization and/or have components possessed across multiple organizations. In this description and the following claims, "cloud computing" is defined as a model for enabling on-demand network access to a shared pool of configurable computing resources (e.g., networks, servers, storage, applications, and services). The definition of "cloud computing" is not limited to any of the other numerous advantages that can be obtained from such a model when properly deployed.

A cloud computing model can be composed of various characteristics, such as on-demand self-service, broad network access, resource pooling, rapid elasticity, measured service, and so forth. A cloud computing model may also come in the form of various service models such as, for example, Software as a Service ("SaaS"), Platform as a Service ("PaaS"), and Infrastructure as a Service ("IaaS"). The cloud computing model may also be deployed using different deployment models such as private cloud, community cloud, public cloud, hybrid cloud, and so forth.

Some embodiments, such as a cloud computing environment, may comprise a system that includes one or more hosts that are each capable of running one or more virtual machines. During operation, virtual machines emulate an operational computing system, supporting an operating system and perhaps one or more other applications as well. In some embodiments, each host includes a hypervisor that emulates virtual resources for the virtual machines using physical resources that are abstracted from view of the virtual machines. The hypervisor also provides proper isolation between the virtual machines. Thus, from the perspective of any given virtual machine, the hypervisor provides the illusion that the virtual machine is interfacing with a physical resource, even though the virtual machine only interfaces with the appearance (e.g., a virtual resource) of a physical resource. Examples of physical resources include processing capacity, memory, disk space, network bandwidth, media drives, and so forth.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

I claim:

1. A method for creating a timber framework within a variable spatial framework for use in designing and manufacturing an architectural component, the method comprising:
   receiving a variable spatial framework for use in designing and manufacturing an architectural component, wherein the variable spatial framework digitally defines the architectural component;
   receiving input to divide the variable spatial framework into one or more independent spaces within the variable spatial framework;
   creating at least a first independent space and a second independent space based upon the received input, wherein creating the first independent space and the second independent space includes:
      associating with at least the first independent space a first independently executable software object and the second independent space a second independently executable software object, each of the first and second independently executable software objects being configured to communicate data to each other, and
   wherein:
      the first independently executable software object and the second independently executable software object each comprise a set of computer-executable instructions used in object-oriented program code, and
      the first independently executable software object and the second independently executable software object each are associated with a different space and executable actions specific to the different spaces;
   automatically incorporating a digital representation of a first timber framework into the first independent space, wherein the characteristics of the first timber framework are determined by the first independently executable software object;
   receiving input to modify one or more characteristics associated with the first independent space; and
   in response to the received input, automatically modifying the second independent space based on the received input, wherein automatically modifying the second independent space includes at least:
      the first independently executable software object automatically sending a communication associated with the received input to the second independently executable software object; and
      in response to receiving the communication, the second independently executable software object automatically modifying one or more characteristics associated with the second independent space,
   wherein the first independently executable software object and the second independently executable software object are mutually configurable.

2. The method as recited in claim 1, further comprising:
   receiving a user specification defining a characteristic of the architectural component; and
   automatically adjusting the first timber framework to account for the received user specification.

3. The method as recited in claim 2, wherein the first independently executable software object performs at least a portion of the automatically adjusting the first timber framework.

4. The method as recited in claim 2, wherein the user specification comprises a material type that will be used to construct the object.

5. The method as recited in claim 2, wherein the user specification comprises a size measurement of the object that will be manufactured.

6. The method as recited in claim 2, wherein the user specification comprises a thickness of a material that will be used to construct the object.

7. The method as recited in claim 1, further comprising:
   identifying a surface associated with a portion of the spatial framework, wherein the surface is representative of a physical surface in the architectural component; and
   receiving input to divide the surface, the surface dividing input changing the surface into multiple independent surfaces.

8. The method as recited in claim 7, wherein the surface comprises a thickness that is also divided by the dividing input.

9. The method as recited in claim 1, further comprising:
   detecting the presence of a second timber framework within the second independent space, which is adjacent to the first independent space.

10. The method as recited in claim 9, further comprising:
    automatically combining at least a portion of the first timber framework and the second timber framework.

11. The method as recited in claim 10, wherein combining at least a portion of the first timber framework and the second timber framework comprises:
    identifying at least one adjacent feature in the first timber framework and the second timber framework that is equivalent; and
    replacing the identified equivalent features with a single common feature.

12. The method as recited in claim 9, further comprising:
    calculating structural integrity requirements for the architectural component, wherein calculating the structural integrity requirements includes accounting for the structural support provided by at least the first timber framework and the second timber framework; and
    based upon the calculated structural integrity requirements, automatically incorporating into the first timber framework and the second timber framework support features.

13. In a computer-based system for automatically creating a timber framework within a variable spatial framework for use in designing and manufacturing an architectural component, the computer-based system comprising one or more processors for receiving and processing instructions, the instructions when executed by the one or more computer processors directing the computer-base system to perform a method comprising:

associating a first independently executable software object with a first independent space within a variable spatial framework;

associating a second independently executable software object with a second independent space within the variable spatial framework, wherein the first independent space and the second independent space are adjacent to each other within the variable spatial framework, each of the first and second independently executable software objects being configured to communicate data to each other, wherein:

the first independently executable software object and the second independently executable software object each comprise a set of computer-executable instructions used in object-oriented program code, and the first independently executable software object and the second independently executable software object each are each associated with a different space and executable actions specific to the different spaces;

automatically incorporating a digital representation of a timber framework into the variable spatial framework, wherein the structure and characteristics of the timber framework are determined by at least both the first independently executable software object and the second independently executable software object;

receiving input to modify one or more characteristics associated with the first independent space; and in response to the received input, automatically modifying the second independent space based on the received input, wherein automatically modifying the second independent space includes at least:

the first independently executable software object automatically sending a communication associated with the received input to the second independently executable software object; and in response to receiving the communication, the second independently executable software object automatically modifying one or more characteristics associated with the second independent space, wherein the first independently executable software object and the second independently executable software object are mutually configurable.

14. The method as recited in claim 13, further comprising:
receiving a user specification defining a characteristic of the architectural component; and
automatically adjusting the timber framework to account for the received material constraint.

15. The method as recited in claim 14, wherein automatically adjusting the timber framework comprises the first independently executable software object incorporating at least one new feature into the architectural component and providing timber framework for the at least one new feature.

16. The method as recited in claim 13, wherein the first independently executable software object provides specifications for building a timber framework that at least partially encloses the first independent space.

17. The method as recited in claim 16, wherein the second independently executable software object provides specifications for building a timber framework that at least partially encloses the second independent space.

18. The method as recited in claim 17, wherein the first independent space and the second independent space share at least a portion of timber framework at a border between the first independent space and the second independent space.

19. The method as recited in claim 13, wherein automatically incorporating the timber framework comprises the first independently executable software object determining structures and characteristics of an architectural sub-component framework that will conform with a particular architectural sub-component.

20. A computer program product for use at a computer system, the computer program product for creating a timber framework within a variable spatial framework for use in designing and manufacturing an architectural component, the computer program product comprising one or more non-transitory computer storage media having stored thereon computer-executable instructions that, when executed at a processor, cause the computer system to perform the method, including the following:

receiving a variable spatial framework for use in designing and manufacturing an architectural component, wherein the variable spatial framework digitally defines the architectural component;

receiving input to divide the variable spatial framework into one or more independent spaces within the variable spatial framework;

creating at least a first independent space and a second independent space based upon the received input, wherein creating the first independent space and the second independent space includes:

associating with at least the first independent space a first independently executable software object and the second independent space a second independently executable software object, each of the first and second independently executable software objects being configured to communicate data to each other, and wherein:

the first independently executable software object and the second independently executable software object each comprise a set of computer-executable instructions used in object-oriented program code, and the first independently executable software object and the second independently executable software object each are associated with a different space and executable actions specific to the different spaces;

automatically incorporating a digital representation of a first timber framework into the first independent space, wherein the characteristics of the first timber framework are determined by the first independently executable software object;

receiving input to modify one or more characteristics associated with the first independent space; and in response to the received input, automatically modifying the second independent space based on the received input, wherein automatically modifying the second independent space includes at least:

the first independently executable software object automatically sending a communication associated with the received input to the second independently executable software object; and in response to receiving the communication, the second independently executable software object automatically modifying one or more characteristics associated with the second independent space, wherein the first independently executable software object and the second independently executable software object are mutually configurable.

* * * * *